US011342339B2

(12) United States Patent
Gardner et al.

(10) Patent No.: US 11,342,339 B2
(45) Date of Patent: May 24, 2022

(54) METHOD OF MAKING SIX TRANSISTOR SRAM CELL USING CONNECTIONS BETWEEN 3D TRANSISTOR STACKS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 17/090,501

(22) Filed: Nov. 5, 2020

(65) Prior Publication Data

US 2021/0202499 A1 Jul. 1, 2021

Related U.S. Application Data

(60) Provisional application No. 62/956,038, filed on Dec. 31, 2019.

(51) Int. Cl.
*H01L 27/11* (2006.01)
*H01L 23/528* (2006.01)
(Continued)

(52) U.S. Cl.
CPC .... *H01L 27/1108* (2013.01); *H01L 21/02603* (2013.01); *H01L 21/823807* (2013.01);
(Continued)

(58) Field of Classification Search
CPC ........... H01L 27/1108; H01L 21/02603; H01L 21/823807; H01L 21/823814; H01L 21/823871; H01L 23/528; H01L 27/0922; H01L 29/0673; H01L 29/42392; H01L 29/66742; H01L 29/78618;
(Continued)

(56) References Cited

U.S. PATENT DOCUMENTS 9,935,204 B2 4/2018 Lee et al.
9,991,261 B2 6/2018 Mitard
(Continued)

OTHER PUBLICATIONS

International Search Report and Written Opinion dated Mar. 3, 2021 in PCT/US2020/059874, 9 pages.

*Primary Examiner* — Tong-Ho Kim
(74) *Attorney, Agent, or Firm* — Oblon, McClelland, Maier & Neustadt, L.L.P.

(57) ABSTRACT

A method of fabricating a semiconductor device includes forming a first stack of first transistor structures on a substrate, and forming a second stack of second transistor structures on the substrate adjacent to the first stack. The second stack is formed adjacent to the first stack such that stacked S/D regions at an end of the first stack are facing respective stacked S/D regions at an end of the second stack. A first pair of facing S/D regions of the first and second stack is connected by forming a connecting structure that extends in the horizontal direction to physically connect the first pair of facing S/D regions to each other. A second pair of facing S/D regions of the first and second stack is maintained as a separated pair of facing S/D regions which are physically separated from one another. First and second metal interconnect structures are connected to respective S/D regions in the second pair of facing S/D regions.

20 Claims, 11 Drawing Sheets

(51) Int. Cl.
  *H01L 27/092* (2006.01)
  *H01L 29/06* (2006.01)
  *H01L 29/423* (2006.01)
  *H01L 29/786* (2006.01)
  *H01L 21/02* (2006.01)
  *H01L 21/8238* (2006.01)
  *H01L 29/66* (2006.01)

(52) U.S. Cl.
  CPC ............. *H01L 21/823814* (2013.01); *H01L 21/823871* (2013.01); *H01L 23/528* (2013.01); *H01L 27/0922* (2013.01); *H01L 29/0673* (2013.01); *H01L 29/42392* (2013.01); *H01L 29/66742* (2013.01); *H01L 29/78618* (2013.01); *H01L 29/78696* (2013.01)

(58) Field of Classification Search
  CPC ........... H01L 29/78696; H01L 21/8221; H01L 29/775; H01L 21/823475; H01L 27/088; H01L 27/0688; H01L 27/092; B82Y 10/00
  USPC ........................................................ 257/351
  See application file for complete search history.

(56) References Cited

U.S. PATENT DOCUMENTS

| | | | |
|---|---|---|---|
| 10,374,099 | B2 | 8/2019 | Lee et al. |
| 10,553,678 | B2 | 2/2020 | Lee et al. |
| 10,553,696 | B2 | 2/2020 | Ando et al. |
| 10,658,462 | B2 | 5/2020 | Lee et al. |
| 10,685,887 | B2 | 6/2020 | Smith et al. |
| 10,741,676 | B2 | 8/2020 | Lee et al. |
| 2017/0040321 | A1 | 2/2017 | Mitard |
| 2017/0162583 | A1 | 6/2017 | Lee et al. |
| 2018/0190835 | A1 | 7/2018 | Lee et al. |
| 2019/0131395 | A1* | 5/2019 | Lee ................. H01L 21/823828 |
| 2019/0157414 | A1 | 5/2019 | Ando et al. |
| 2019/0172755 | A1 | 6/2019 | Smith et al. |
| 2019/0319137 | A1 | 10/2019 | Lee et al. |
| 2020/0020768 | A1 | 1/2020 | Lee et al. |
| 2020/0105896 | A1 | 4/2020 | Ando et al. |
| 2020/0111886 | A1 | 4/2020 | Ando et al. |
| 2020/0357932 | A1 | 11/2020 | Lee et al. |

* cited by examiner

METHOD OF MAKING SIX TRANSISTOR SRAM CELL USING CONNECTIONS BETWEEN 3D TRANSISTOR STACKS

CROSS REFERENCE TO RELATED PATENTS AND APPLICATIONS

This application claims priority to and the benefit of the filing date of U.S. Provisional Patent Application Ser. No. 62/956,038, filed Dec. 31, 2019, which application is incorporated herein by reference in its entirety.

BACKGROUND OF THE INVENTION

Field of the Invention

This disclosure relates to integrated circuits and the fabrication of 3D microelectronic devices.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. the contacted gate pitch of two-dimensional transistor density scaling reaches its scaling limit due to manufacturing variability and electrostatic device limitations. New transistor designs, such as vertical channel gate-all-around transistors, may be able to overcome some contacted gate pitch scaling limits, however, resistance, capacitance, and reliability concerns limit wire pitch scaling, thereby limiting the density with which transistors can be wired into circuits. Semiconductor device fabricators have expressed a desire for three-dimensional (3D) semiconductor circuits in which transistors are stacked on top of each other.

SUMMARY OF THE INVENTION

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the detailed description section and corresponding figures of the present disclosure as further discussed below.

An aspect (1) includes a method of fabricating a semiconductor device. The method includes forming a first stack of first transistor structures on a substrate, each first transistor structure including a channel extending in a horizontal direction along a surface of the substrate and a pair of S/D regions formed on opposite ends of the channel. The first transistor structures are stacked in a vertical direction along a thickness direction of the substrate such that channel regions of the first stack are positioned over one another and S/D regions of the first stack are positioned over one another. A second stack of second transistor structures is formed on the substrate adjacent to the first stack, each second transistor structure including a channel extending in the horizontal direction and a pair of S/D regions formed on opposite ends of the channel, wherein the second transistor structures are stacked along the vertical direction such that channel regions of the second stack are positioned over one another and S/D regions of the second stack are positioned over one another. The second stack is formed adjacent to the first stack such that stacked S/D regions at an end of the first stack are facing respective stacked S/D regions at an end of the second stack. A first pair of facing S/D regions of the first and second stack are connected by forming a connecting structure that extends in the horizontal direction to physically connect the first pair of facing S/D regions to each other. A second pair of facing S/D regions of the first and second stack is maintained as a separated pair of facing S/D regions which are physically separated from one another. First and second metal interconnect structures are connected to respective S/D regions in the second pair of facing S/D regions.

An aspect (2) includes the method of aspect (1), wherein forming the first and second stacks includes forming the channels of the first stack, forming the channels of the second stack adjacent to the first stack, forming the S/D regions of the first stack while an area of the second stack is covered with protective material, and forming the S/D regions of the second stack while an area of the first stack is covered with protective material.

An aspect (3) includes the method of aspect (2), wherein the forming S/D regions of the first stack includes simultaneously forming S/D regions of the same conductivity type on all channels of the first stack.

An aspect (4) includes the method of aspect (3), wherein the forming S/D regions of the second stack includes forming S/D regions of a first conductivity type on one of channels of the second stack while other channels of the second stack are covered with protective material, and forming S/D regions of a second conductivity type on another one of channels of the second stack while the S/D regions of the first conductivity type are covered with protective material.

An aspect (5) includes the method of aspect (1), wherein the connecting a first pair of facing S/D regions includes growing connecting material from each S/D region in the first pair toward each other S/D region in the first pair of facing S/D regions.

An aspect (6) includes the method of aspect (5), wherein the growing includes growing the connecting material from each S/D region in the first pair toward each other S/D region in the first pair of facing S/D regions until the connecting material joins to physically connect the S/D regions of the first pair of facing S/D regions to each other.

An aspect (7) includes the method of aspect (6), further including forming a metal on the connecting material.

An aspect (8) includes the method of aspect (5), wherein the growing includes growing the connecting material from each S/D region in the first pair toward each other S/D region in the first pair of facing S/D regions without joining the connecting material.

An aspect (9) includes the method of aspect (8), further including forming a metal on the connecting material such that the metal joins the connecting material to physically connect the S/D regions of the first pair of facing S/D regions to each other.

An aspect (10) includes a three dimensional (3D) semiconductor device including a first stack of first transistor structures formed on a substrate, each first transistor structure including a channel extending in a horizontal direction along a surface of the substrate and a pair of S/D regions formed on opposite ends of the channel. The first transistor structures are stacked along a vertical direction along thickness direction of the substrate such that channel regions of the first stack are positioned over one another and S/D regions of the first stack are positioned over one another. A second stack of second transistor structures is formed on the substrate adjacent to the first stack, each second transistor structure including a channel extending in the horizontal direction and a pair of S/D regions formed on opposite ends of the channel. The second transistor structures are stacked along the vertical direction such that channel regions of the second stack are positioned over one another and S/D regions of the second stack are positioned over one another, and the second stack formed adjacent to the first stack such that stacked S/D regions at an end of the first stack are facing respective stacked S/D regions at an end of the second stack. A connecting structure extends in the horizontal direction to physically connect a first pair of facing S/D regions to each other. First and second metal interconnect structures connected to respective S/D regions in a second pair of facing S/D regions of the first and second stack, the second pair of facing S/D regions being physically separated from one another of the first and second stack as a separated pair of facing S/D regions which are physically separated from each other.

An aspect (11) includes the device of aspect (10), wherein at least one of the first and second stacks has S/D regions all of a same conductivity type.

An aspect (12) includes the device of aspect (10), wherein at least one of the first and second stacks has S/D regions of different conductivity types.

An aspect (13) includes the device of aspect (10), wherein the connecting structure includes epitaxially grown connecting material which physically connects the S/D regions of the first pair of facing S/D regions to each other.

An aspect (14) includes the device of aspect (10), wherein the connecting structure includes epitaxially grown connecting material which does not connect the S/D regions of the first pair of facing S/D regions, and a metal formed on the connecting material such that the metal joins the connecting material to physically connect the S/D regions of the first pair of facing S/D regions to each other.

An aspect (15) includes a method of fabricating a semiconductor device. The method includes forming a first stack of transistor channels adjacent to a second stack of transistor channels, the stacks of transistor channels being gate-all-around transistor channels that extend horizontally and that are aligned vertically in that transistor channels are positioned over each other, and forming first source/drain regions on transistor channels of the first stack while transistor channels of the second stack are covered. source/drain regions are formed on transistor channels of the second stack while source/drain regions on the first stack are covered, wherein forming source/drain regions on transistor channels of the second stack is executed with step-wise uncovering of channel ends to form either N-doped or P-doped source/drain regions selectively. First adjacent source/drain regions are grown together between the first stack and the second stack while maintaining second adjacent source/drain regions physically separated from each other. Transistors in the first stack and the second stack are electrically connected to form an SRAM cell.

An aspect (16) includes the method of aspect (15), wherein the growing first adjacent source/drain regions together forms a source/drain connection for an inverter pair of transistors for the SRAM cell.

An aspect (17) includes the method of aspect (16), wherein the maintaining second adjacent source/drain regions physically separated from each other forms pass transistors of the SRAM cell.

An aspect (18) includes the method of aspect (17), wherein the SRAM cell is a six transistor SRAM cell, the method further including growing third first adjacent source/drain regions together between the first stack and the second stack to form another inverter pair of transistors for the SRAM cell while maintaining the second adjacent source/drain regions physically separated from each other.

An aspect (19) includes the method of aspect (18), further including forming the pass transistors positioned as top channels of the first stack and the second stack.

An aspect (20) includes the method of aspect (18), further including forming the pass transistors positioned as bottom channels of the first stack and the second stack.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
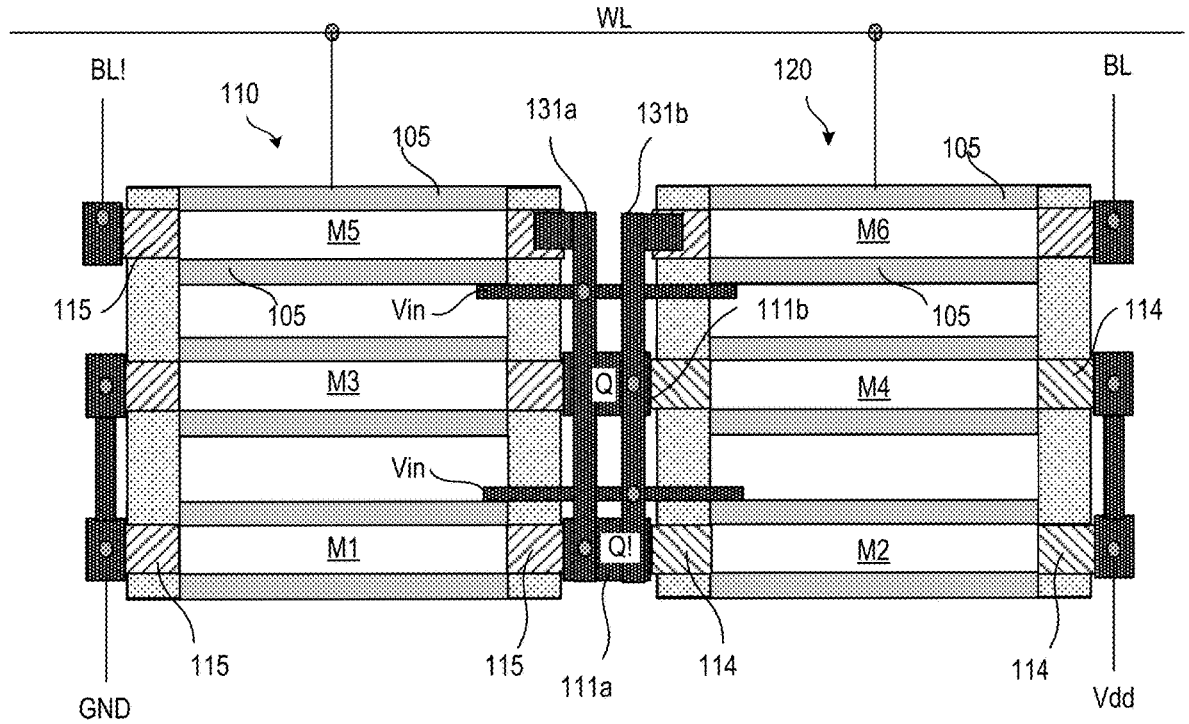
FIG. 1 is a cross section of a substrate segment showing an example 3D semiconductor device in accordance with an embodiment of the present disclosure.

In the drawings, like reference numerals designate identical or corresponding parts throughout the several views. Further, as used herein, the words "a," "an" and the like generally carry a meaning of "one or more," unless stated otherwise. The drawings are not generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Further, spatially relative terms, such as "beneath," "below," "lower," "above," "upper" "top" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

As noted in the Background, semiconductor device fabricators have expressed a desire for three-dimensional (3D) semiconductor circuits in which transistors are stacked on top of each other. 3D integration is an option for overcoming the inevitable saturation in critical dimension scaling. 3D integration, i.e. the vertical stacking of multiple devices, may overcome these scaling limitations by increasing transistor density in volume rather than area. Vertical stacking has been successfully demonstrated and implemented by the flash memory industry with the adoption of 3D NAND, but application to random logic designs is substantially more difficult. Mainstream CMOS VLSI scaling, as used for example in CPU or GPU products, is investigating 3D integration as a primary means of moving the semiconductor roadmap forward, and thus requires enabling technologies.

Techniques herein overcome significant challenges to make 3D logic integration feasible by, for example, eliminating connections and simplifying layout and transistor hookup. A reduced 3D layout size is enabled because connection space is reduced. Moreover, all transistors in 3D stacks herein can be used for logic cells and memory including static random-access memory (SRAM).

An SRAM cell includes two inverter transistor pairs M2/M1 and M4/M3. Techniques herein include methods and designs to connect source/drain regions of these devices. Several advantages are realized. Two connections can be eliminated. Reduced layout size is enabled because connection space is reduced. Also, pass transistors can be separated, and buried power rail can be integrated.

Aspects of the present disclosure describe 3D logic devices with inverter planes, such as SRAM (static random-access memory) cells. Methods herein include process flows for grown epitaxial connections for SRAM scaling. One embodiment includes a grown silicon connection between 3D transistor stacks with SRAM, NMOS access transistors on top. Another embodiment includes grown silicon connection between 3D transistor stacks with SRAM, NMOS access transistors on bottom.

Figure 6:
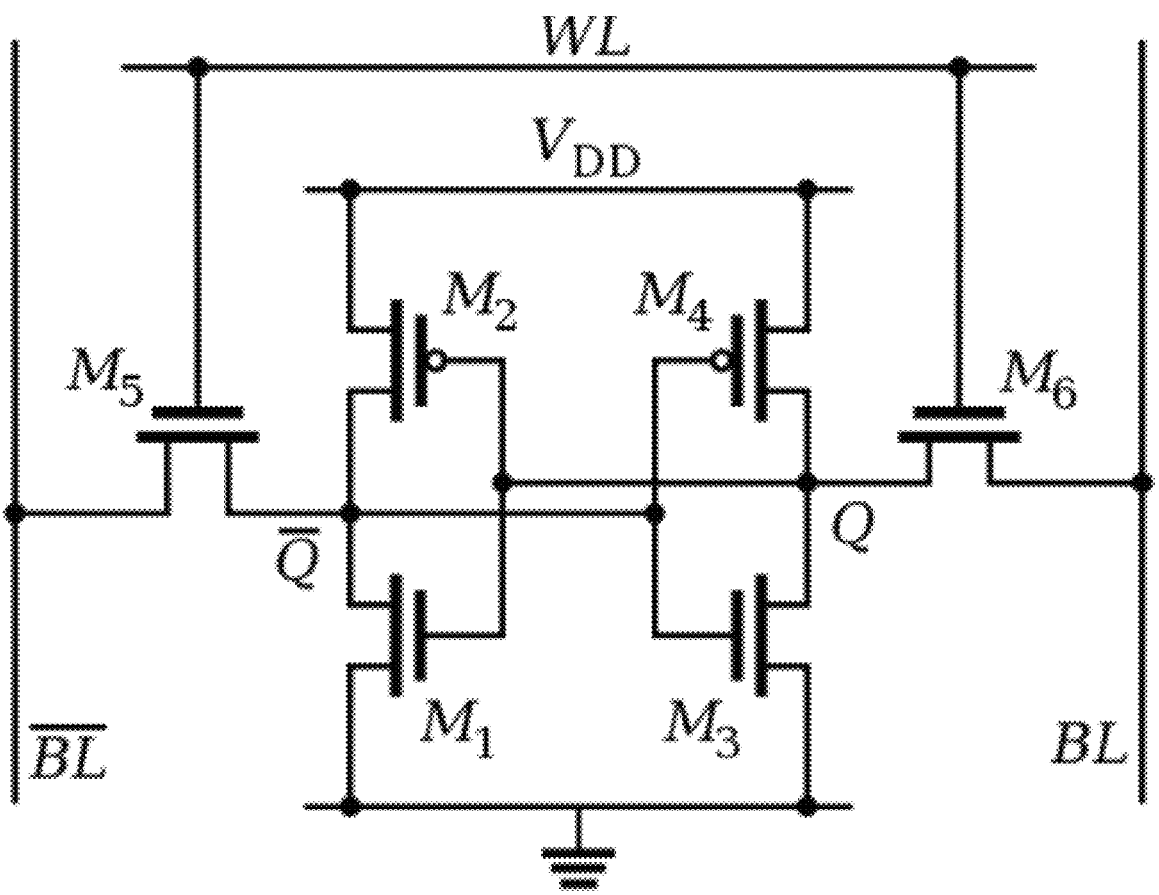
FIG. 6 depicts the circuit diagram of an SRAM cell.

FIG. 6 is the circuit diagram of an SRAM cell which has two inverters ($M_1$ in series with $M_2$, and $M_3$ in series with $M_4$) and two pass transistors ($M_5$ and $M_6$) that include the SRAM cell. WL refers to a "word line" and BL refers to a "bit line". BL! denotes a bit line of the same magnitude as BL, but of opposite polarity. Note that the gates of pass transistors $M_5$ and $M_6$ are connected to the word line, WL, and the gates of $M_1$ and $M_2$ are in series and connected to bit line BL. The gate of $M_2$ inverts the signal from the bit line BL (as passed by $M_6$ upon a signal from WL), thus either $M_1$ is ON or $M_2$ is ON, depending on the polarity of the signal on BL. Similarly, the gates of $M_3$ and $M_4$ are in series and connected to bit line BL!. The gate of $M_4$ inverts the signal from the bit line BL (as passed by $M_5$ upon a signal from WL), thus either $M_3$ is ON or $M_4$ is ON, depending on the polarity of the signal on BL!. VDD and ground will be connected to the SRAM cell by buried power rails (BPR) within the cell. Note that $M_2$ and $M_4$ are PMOS devices and $M_1$, $M_3$, $M_5$ and $M_6$ are NMOS devices. However, this configuration may be reversed so that $M_2$ and $M_4$ are NMOS devices and $M_1$, $M_3$, $M_5$ and $M_6$ are PMOS devices.

FIG. 1 is a cross section of a substrate segment showing an example 3D semiconductor device in accordance with embodiments of the present disclosure. This example implements the SRAM cell of FIG. 6 by way of a side-by-side 6T SRAM cell. In the embodiment of FIG. 1, access transistors are on a top of the cell, and bit lines (BL and BL!) and word lines (WL) hook up to the cell from the top. Buried power rails for Vdd and GND hook up from the bottom of the cell. A buried power rail is a power rail positioned below active devices. The buried power rail can be formed in a bulk silicon area.

As seen in FIG. 1, the 3D SRAM cell includes stack 110 of transistors M1, M3 and M5 positioned over one another, and stack 120 of transistors M2, M4 and M6 positioned over one another. Each transistor M1-M6 includes a channel extending in a horizontal direction along a surface of the substrate, and a pair of S/D regions formed on opposite ends of the channel. As seen, the stack 110 includes transistors having N+ epitaxial S/D regions 115, while the stack 120 includes both P+ epitaxial S/D regions 114 and N+ epitaxial S/D regions. In the embodiment of FIG. 1, the transistors are implemented as nano-channels. Nano-channels refer to either nano-sheets or nano-wires. These are semiconductor channels that are part of a field-effect transistor (FET) that is a gate-all-around (GAA) device in that gate material is or will be formed on all around a cross-section of the channel. A gate-all-around (GAAFET), is a non-planar 3D transistor which is similar in concept to a FinFET except that the gate material surrounds the channel region on all sides. Depending on design, gate-all-around FETs can have two or more effective gates. Gate-all-around FETs may utilize a stack of silicon nanowires with a gate completely surrounding it. Channels can be round, square, rectangular or other shapes. Nano-channels can be formed by epitaxial growth. For example, a first epitaxial stack is formed on a topside surface of a first substrate. For example, a CFET (complementary FET) process flow can be followed up by post nano-stack epi growth.

As also seen in FIG. 1, the stacks 110 and 120 are formed adjacent to one another such that that stacked S/D regions at an end of the stack 110 are facing respective stacked S/D regions at an end of the stack 120. A connecting structure 111a extends in the horizontal direction to physically connect a first pair of facing S/D regions for M1 and M2 of the stacks to each other. Similarly, a connecting structure 111b extends in the horizontal direction to physically connect a second pair of facing S/D regions for M3 and M4 of the stacks to each other. Connecting structure 111a corresponds to Q! of FIG. 6, and connecting structure 111b corresponds to Q of FIG. 6. Facing S/D regions for M5 and M6 remain separated. Local metal interconnect structures electrically connect the transistors to form an SRAM cell, with electrical connections denoted by nodes 101. In the embodiment of FIG. 1, first and second metal interconnect structures 131a, 131b contact facing S/D regions of M5 and M6 which are maintained as physically separated from one another.

Figure 2:
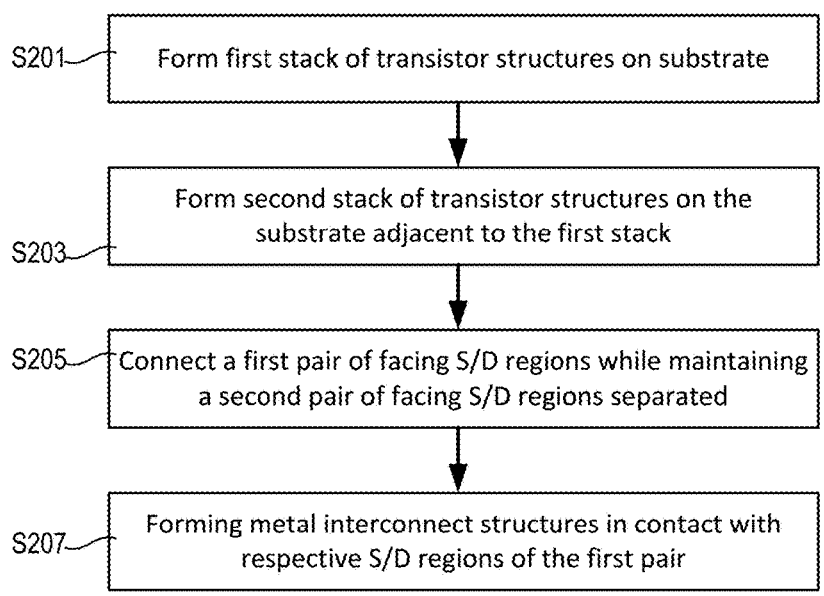
FIG. 2 is a flow chart for forming a 3D semiconductor device in accordance with embodiments of the present disclosure.

FIG. 2 is a flow chart for forming a 3D semiconductor device such as the SRAM cell of FIG. 1. The process begins in step 201 with forming a first stack of first transistor structures on a substrate. Each first transistor structure includes a channel extending in a horizontal direction along a surface of the substrate and a pair of S/D regions formed on opposite ends of the channel. The first transistor structures are stacked in a vertical direction along thickness direction of the substrate such that channel regions of the first stack are positioned over one another and S/D regions of the first stack are positioned over one another.

In step 203, a second stack of second transistor structures is formed on the substrate adjacent to the first stack. Each second transistor structure includes a channel extending in a horizontal direction along a surface of the substrate and a pair of S/D regions formed on opposite ends of the channel. The second transistor structures are stacked along a vertical direction along thickness direction of the substrate such that channel regions of the first stack are positioned over one another and S/D regions of the first stack are positioned over one another. The second stack of transistor structures is formed adjacent to the first stack such that stacked S/D regions at an end of the first stack are facing respective stacked S/D regions at an end of the second stack.

In step 205, a first pair of facing S/D regions of the first and second stack are connected by forming a connecting structure that extends in the horizontal direction to physically connect the first pair of facing S/D regions to each other. The connection is done while maintaining a second pair of facing S/D regions of the first and second stack as a separated pair of facing S/D regions which are physically separated from one another.

In step 207, first and second metal interconnect structures are connected to respective S/D regions in the second pair of facing S/D regions, while maintaining these facing regions separated from each other.

Figure 3A:
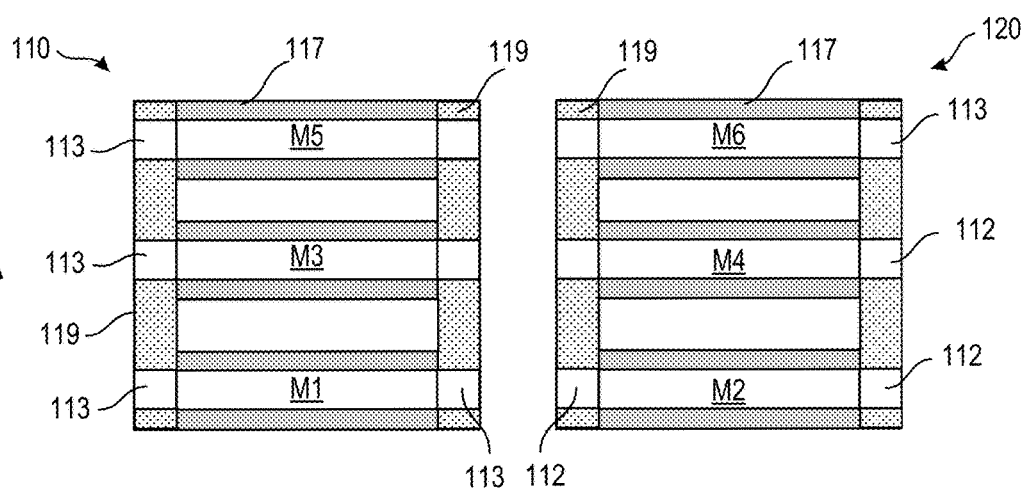
FIGS. 3A, 3B, 3C, 3D, 3E, 3F, 3G, 3H, 3I, 3J, 3K, 3L, 3M, 3M' and 3N are cross sectional views of intermediate structures in an example process of forming the SRAM cell of FIG. 1.
Figure 3B:
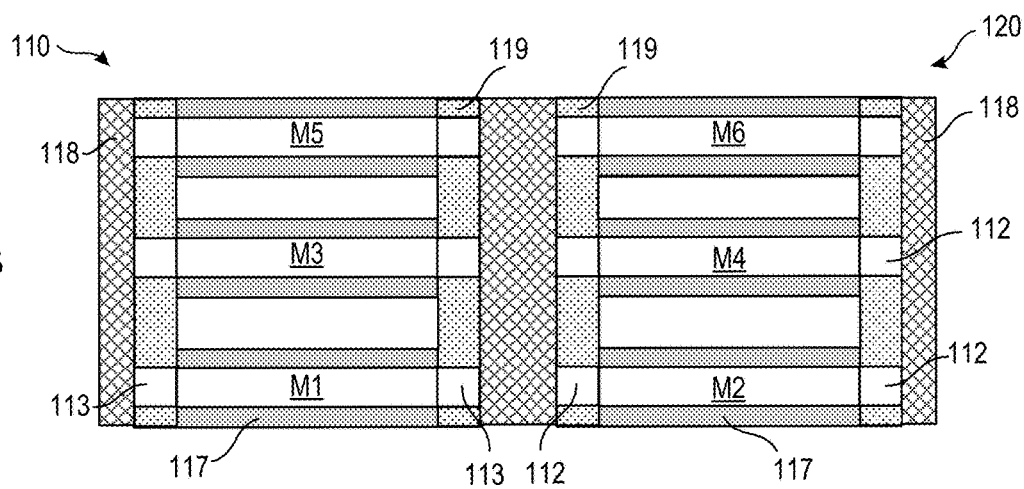
Figure 3C:
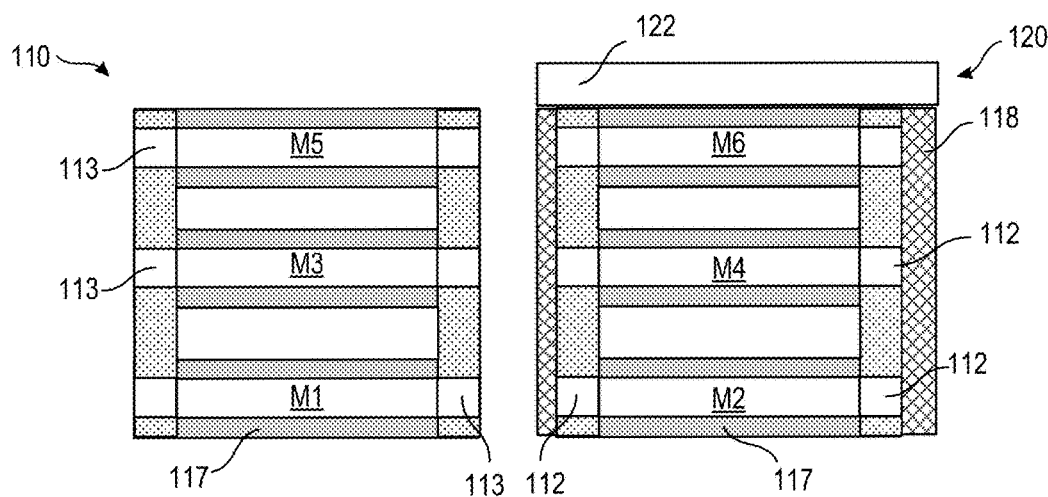
Figure 3D:
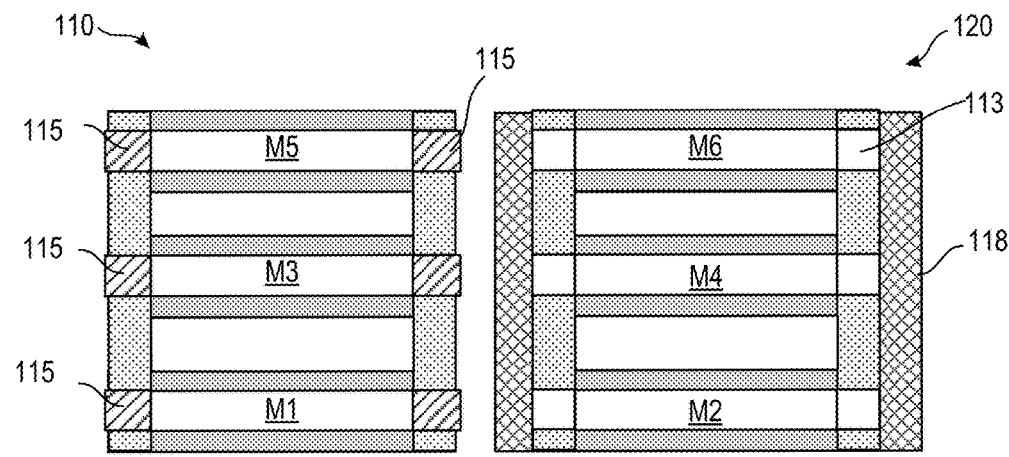
Figure 3E:
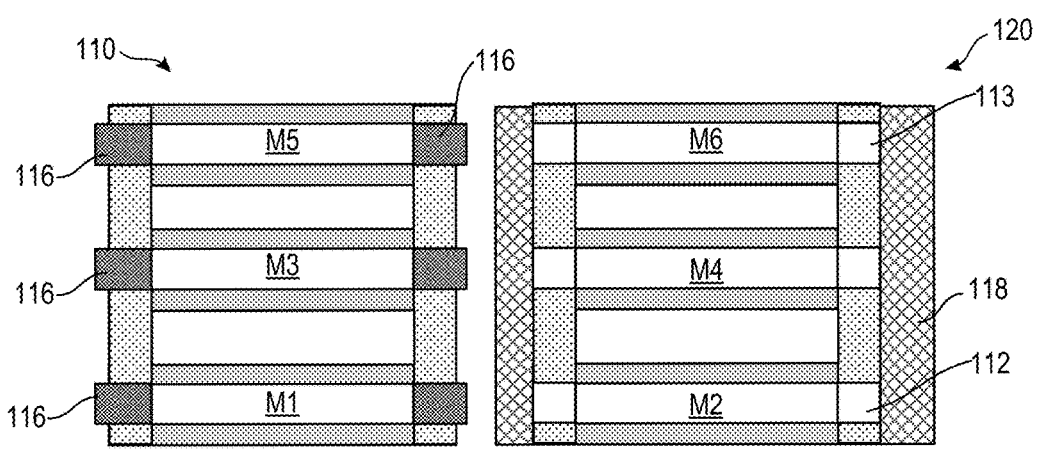
Figure 3F:
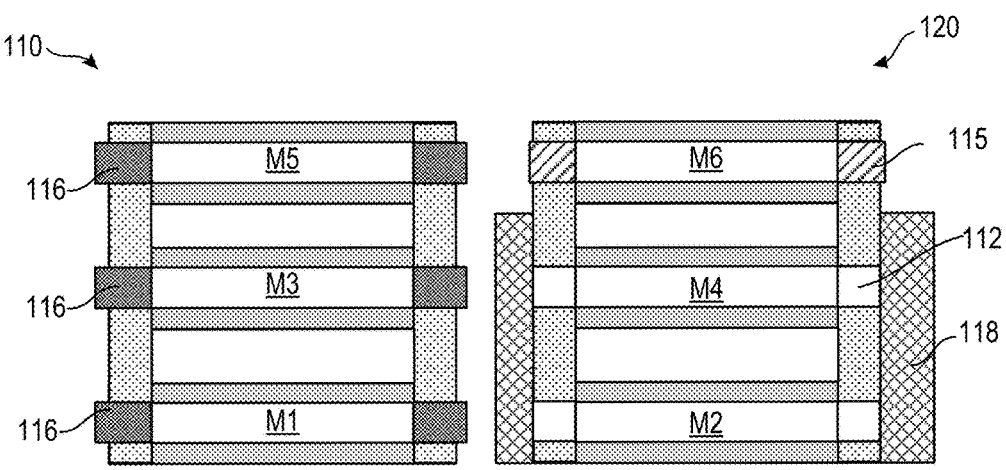
Figure 3G:
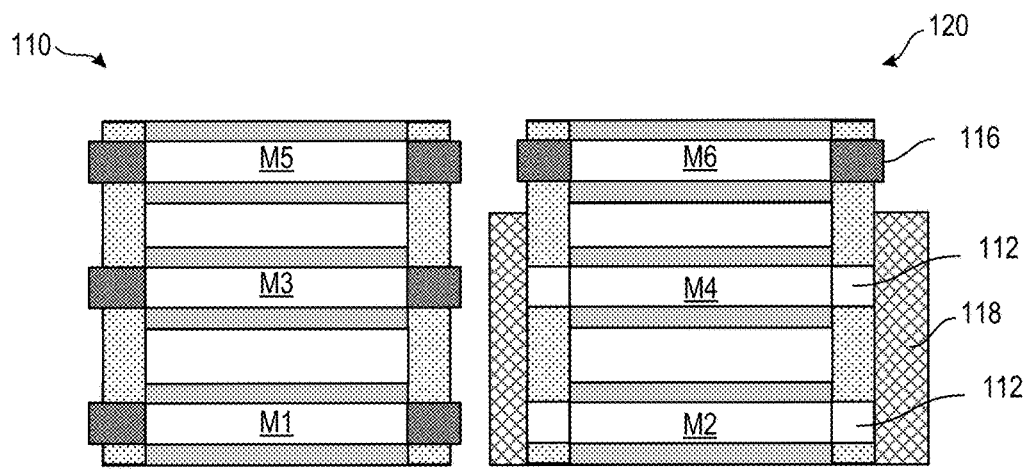
Figure 3H:
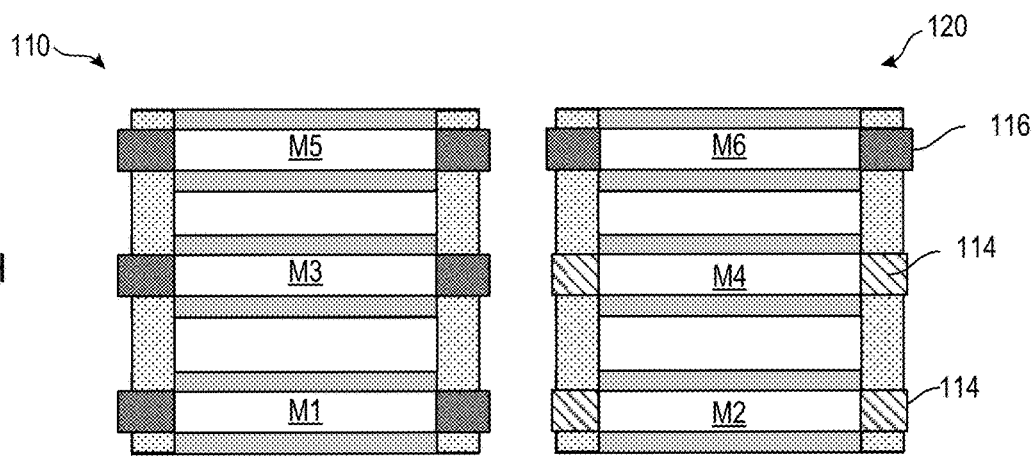
Figure 3I:
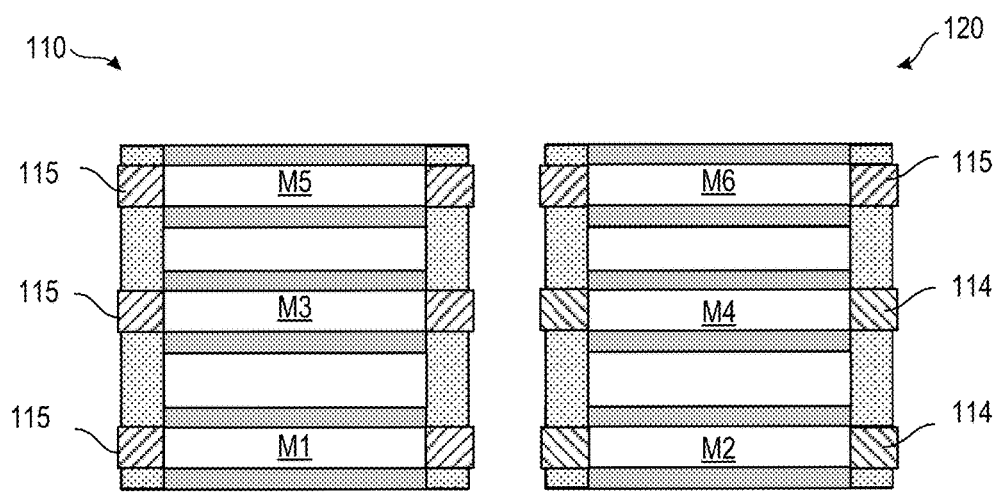
Figure 3J:
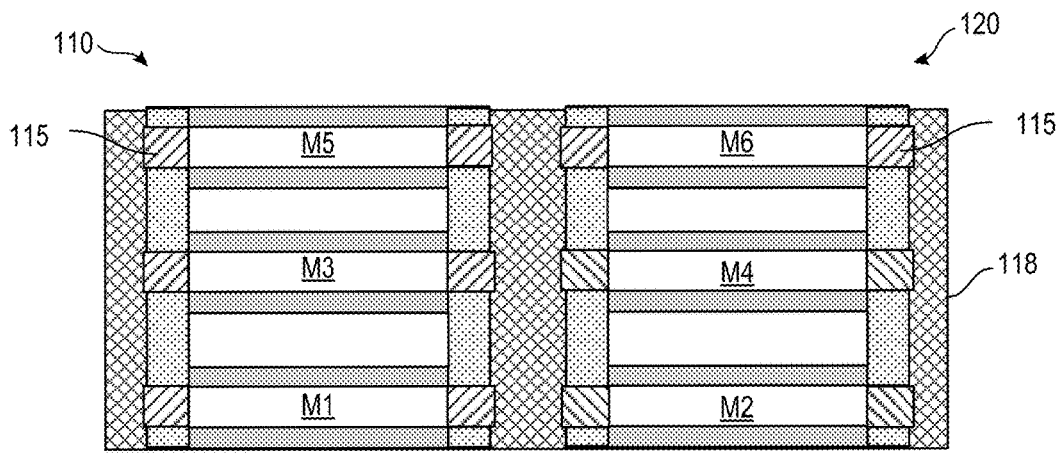
Figure 3K:
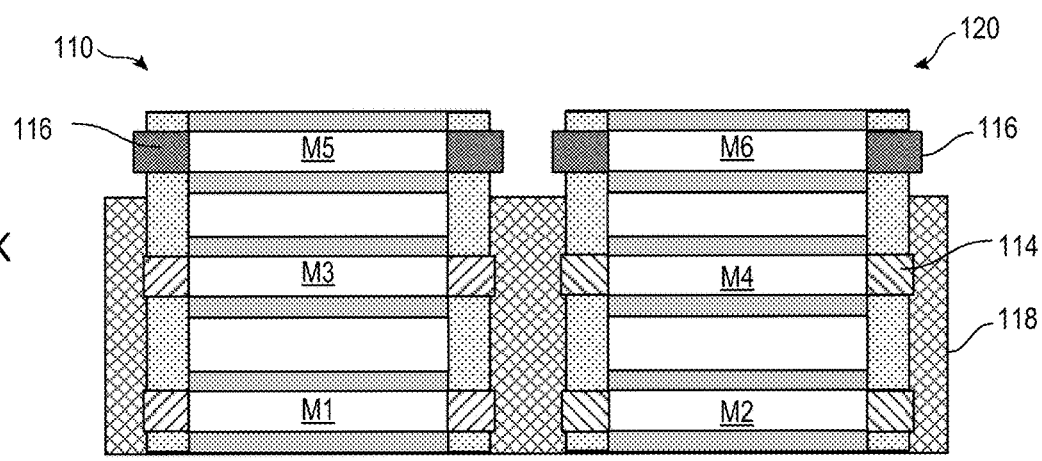
Figure 3L:
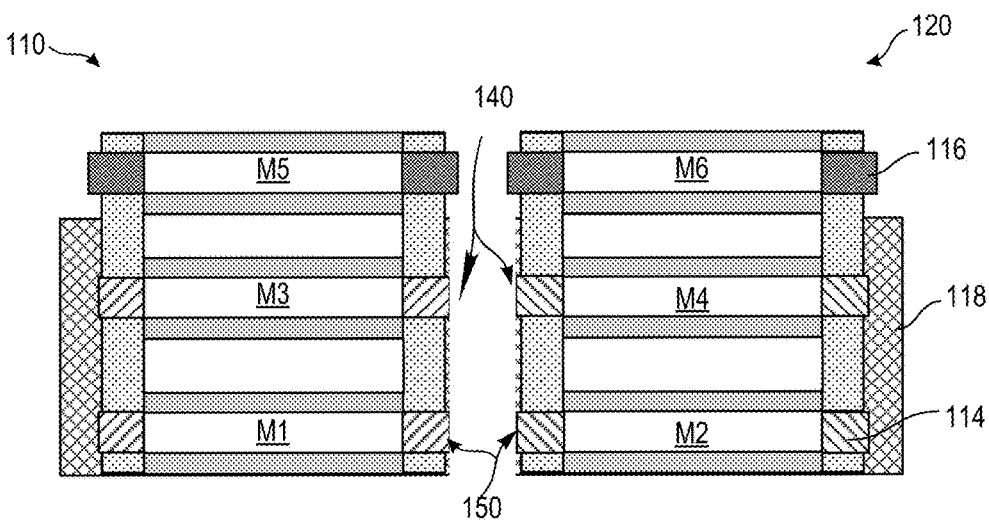
Figure 3M:
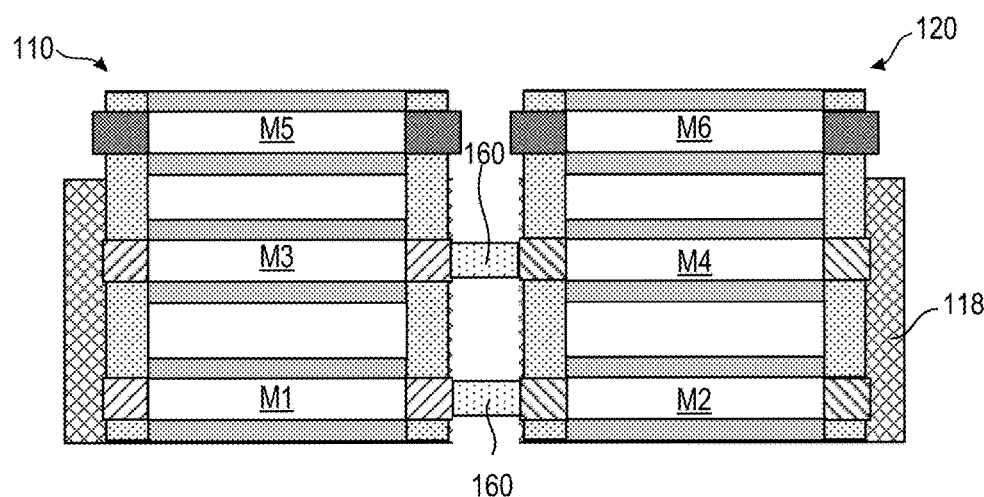
Figure 3M:
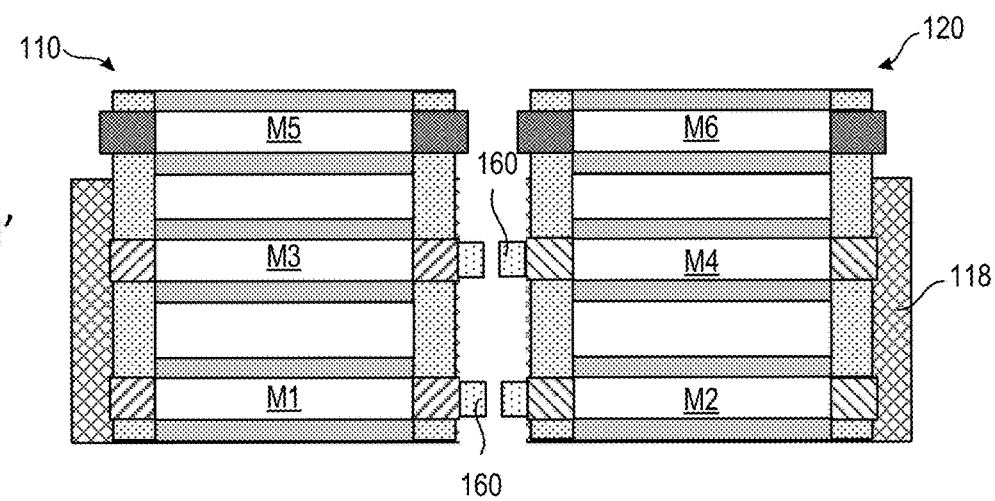
Figure 3N:
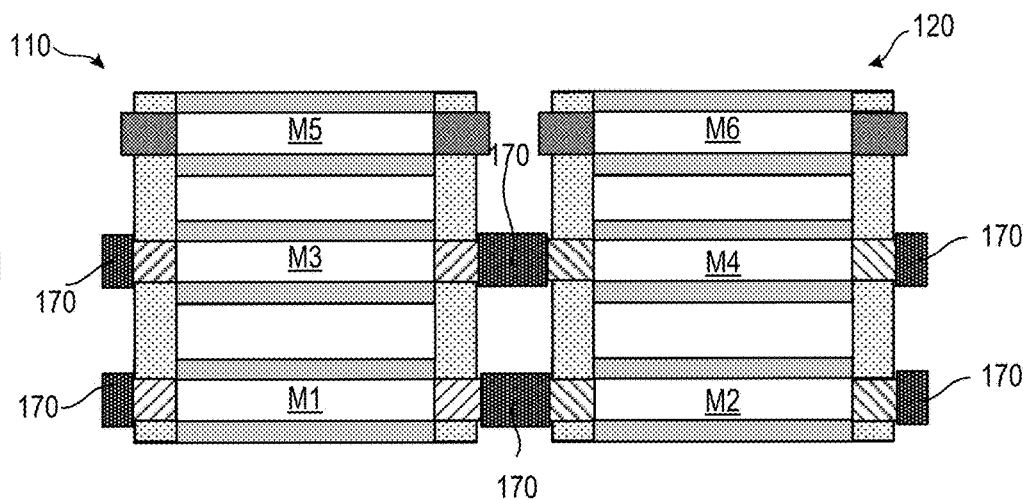

FIGS. 3A-3N are cross sections of intermediate structures formed during the process of fabricating the 3D SRAM of FIG. 2. FIG. 3A shows a cross-section of an SRAM cell having stacked nano-channels which form the transistors M1-M6 of FIG. 2. Note that the initial stacks can be formed using alternating layers of epitaxially grown semiconductor material, which can be selectively removed and replaced. In one example embodiment, up to about 12 or more alternating silicon germanium (SiGe) and silicon monoplane stacks are formed. Note that fewer than 12 layers can be formed. Next, the epitaxial stacks can be cut into fin structures using an etch mask. SiGe material can be optionally removed and replaced with a dielectric. Doping of channel materials can be accomplished before or after the formation of source/drains. The result is that vertical stacks of GAA channels may be formed on a substrate as shown in FIG. 3A. A gate protect material 117 is shown protecting channels (M1-M6). Future S/D regions are shown but not yet formed. Channels M1, M3, M5, and M6 have future N+ regions 113, while channels M4 and M2 have future P+ regions 112. Vdd and ground hookup can be formed using a buried power line (not shown).

Although FIG. 3A shows only two adjacent stacks, there may be a plurality of stacks formed by the processes of the present disclosure. For example, there may be a second set of stacks extending behind and/or extending to the right and/or the left of the first set of stacks. FIGS. 3A-3N illustrate the processing of two adjacent stacks for the sake of clarity and are not to be construed as limiting the number of stacks which can be formed on the substrate and processed by the methods of the present disclosure.

Each channel may have a different material composition and doping, or may have uniform materials. Channels may have a gate protect material 117 formed thereon for subsequent replacement with a functional gate which fully surrounds each nano-channel. In a non-limiting example, the gate protection material may be a high-K dielectric. In a non-limiting example, the high-K dielectric may be selected from the group of hafnium silicon oxide (HfSiO), hafnium oxide ($HfO_2$), hafnium chromium oxide (HfCrO), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), scandium (III) oxide $Sc_2O_3$, lanthanum oxide $La_2O_3$, lutetium oxide $Lu_2O_3$, niobium (V) oxide $Nb_2O_5$, tantalum pentoxide $Ta_2O_5$, or a combination thereof.

An inner spacer 119 separates each respective nano-channel from an adjacent nano-channel, that is, M1 from M3, M3 from M5, M2 from M4, and M4 from M6. Spaces between nano-channel stacks can be filled with oxide fill material or other dielectric. In a non-limiting example, the fill material may be SiO, SiO2, silicon nitride, nitride oxide, or other dielectrics. The other dielectrics may be low or high K dielectrics, where K is in the range of 1.5 to 3.0. Some examples are derivatives of oxides such as fluorine (F) doped oxides, carbon (C) doped oxides, hafnium (H) doped oxides or vapor deposited organic materials, such as polyimides, or highly porous oxides, such as hafnium silicate ($HfSiO_4$), zirconium silicate ($ZrSiO_4$), and barium titanate ($BaTiO_3$).

In FIG. 3B, oxide 118 (silicon oxide or other dielectric) is deposited, and polished down to a top of the transistor stacks. An etch mask 122 (photoresist) is formed over the right stack 120 as shown in FIG. 3C, and then uncovered oxide is etched (removed) directionally. In FIG. 3C, oxide 118 covering the left stack 110 has been removed by directional etching while a photoresist etch mask 122 covers the right stack 120. The directional etching uncovers future N+S/D regions 113 of channels M1, M3, and M5.

In FIG. 3D, the photoresist etch mask 122 has been removed and oxide 118 remains to cover the sides of stack 120. The oxide 118 may be any protective material, such as a nitride. This is followed by N+ epitaxial growth on the left stack 110 to form each S/D region 115. Epitaxial growth refers to a type of crystal growth or material deposition in which new crystalline layers are formed with a well-defined orientation with respect to the crystalline substrate. N+ represents silicon doped by high concentrations of dopants, such as phosphorus, arsenic or antimony. P+ represents silicon doped by high concentrations of dopants, such as boron atoms. Boron, arsenic, phosphorus, and occasionally gallium are used to dope silicon. Boron is the p-type dopant of choice for silicon integrated circuit production because it diffuses at a rate that makes junction depths easily controllable. Phosphorus is typically used for bulk-doping of silicon wafers, while arsenic is used to diffuse junctions, because it diffuses more slowly than phosphorus and is thus more controllable. A high concentration may be "degenerate", or greater than $10^{18}$ atoms/cm$^3$ at room temperature, causing the material to act like a metal. Doping concentrations for silicon semiconductors may range anywhere from $10^{13}$/cm$^3$ to $10^{18}$/cm$^3$. Degenerately doped silicon contains a proportion of impurity to silicon on the order of parts per thousand. N+ or P+ epitaxial growth of the S/D regions is performed by using vapor-phase epitaxy (VPE), a modification of chemical vapor deposition. During deposition, the epitaxial layer is doped by adding impurities to a source gas, such as arsine, phosphine or diborane depending on whether an N+ or P+ S/D region is being formed.

As shown in FIG. 3E, the newly grown N+S/D regions 115 are then selectively covered with a protection film 116. For example, a selective high-K deposition is executed to cover up N+ regions on the left stack 110. Alternatively, a low temperature oxide growth may be executed to protect the uncovered S/D regions. The protective film (e.g., high-k layer) 116 may be selected from the group including HfO$_2$, Al$_2$O$_3$, Y$_2$O$_3$, ZrO$_2$, HfZrO$_4$, TiO$_2$, Sc$_2$O$_3$, La$_2$O$_3$, Lu$_2$O$_3$, Nb$_2$O$_5$, Ta$_2$O$_5$.

Next, from a top-down direction, a portion of the second nano-channel stack 120 is uncovered while one or more nano-channels positioned under that portion remain covered. The step can be performed by a reactive-ion etch (RIE) that directionally etches oxide until uncovering a channel. The portion uncovered can reveal ends of one or more nano-channels. In the example in FIG. 3F, channel M6 is uncovered, while channels M4 and M2 remain covered. N+ epitaxial S/D regions 115 are then grown for channel M6. This can be followed by selective deposition of a protective film 116, such as a high-K film, over the N+ S/D regions of the right stack 120 as shown in FIG. 3G.

The remaining oxide covering the ends of the second nano-channel stack 120 on the right is removed by reactive ion etching, which uncovers future P+ S/D regions 112. P+ epitaxial S/D regions 114 are then grown on the stack 120 on the right, as shown in FIG. 3H. These are the last to be formed of S/D regions so there is no need to deposit a protective film on these P+ S/D regions. FIG. 3I shows the protective film removed from all S/D regions with both stacks completed and with each stack having different S/D formation. At this point, all the S/D regions are formed for 3D SRAM.

An oxide or insulator is then deposited on the substrate to cover all S/D regions for 6T 3D cell, and polished back as shown in FIG. 3J. In step 3K, an etch step is executed to uncover M5 and M6, followed by selective deposition of a protective material (e.g., high K material) 116 on the S/D regions of these transistors to protect from a subsequent process. Another etch step is then executed to uncovered S/D edges 140 for M3/M4 and S/D edges 150 for M1/M2, edges as shown in FIG. 3L.

In FIG. 3M, connection material 160 is epitaxially grown to connect the M3 and M4 regions together, and to connect the M1 and M2 regions together. Note that the M5/M6 region will not grow together because they are covered by high-k material or other protectant. These transistors are kept separate to become pass transistors. FIG. 3M' shows an alternative to FIG. 3M. As seen, a small gap may be left between M3 and M4, and between M1 and M2 regions. After forming connection structures as shown in FIG. 3M or 3M', a wet oxide etch is used to uncover the remaining edges of the N+ and P+ regions of M1-M4 transistors. A metal 170, such as Ru, is then deposited on the connection structures and the exposed edges as seen in FIG. 3N. Where connection material 160 is partially grown as shown in FIG. 3M', the metal 170 fills the gap to complete the connection structures. Ru can be polished, and then salicidation can be executed, then stripped to make good connections. At this point, the S/D regions of inverter pairs of the SRAM cell are formed and S/D regions of the pass transistors are not connected and can be individually accessed in the SRAM circuit.

Further steps for finishing the SRAM circuit include forming local interconnects, replacement gate processing, and gate cut followed by additional metallization (not shown). Steps may include TiN, TaN, TiAl depositions, replacement metal gate P-type work function metal (RMG PWFM) removal, RMG final, gate cut (CMG), and forming M0 and M1 dual damascene metal layer horizontal and vertical connections, where M0 refers to a lower metal layer of the stack and M1 refers to an upper metal layer of the stack. Vertical vias may be used to connect wiring to the M0 and M1 layers, as is known in the art.

The work function metal layer may be a p-type or an n-type work function layer depending on the type (PFET or NFET) of the device. The p-type work function layer includes a metal selected from but not restricted to the group of titanium nitride (TiN), tantalum nitride (TaN), ruthenium (Ru), molybdenum (Mo), tungsten (W), platinum (Pt), or combinations thereof. The n-type work function layer includes a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. A metal fill layer may include aluminum (Al), tungsten (W), cobalt (Co), and/or other suitable materials.

In the dual damascene process, the structure undergoes a diffusion barrier etch step, after which a via dielectric is deposited. An etch step then forms a gap in which the lines and vias are formed.

A thin layer of barrier of tantalum (Ta) and tantalum nitride (TaN) materials are deposited using physical vapor deposition (PVD). Ta is used to form the liner and TaN is for the barrier in a structure. The barrier layer is coated over by a copper seed barrier via physical vapor deposition (PVD). And finally, the structure is electroplated with copper and polished planar using chemical mechanical polishing (CMP).

Figure 4:
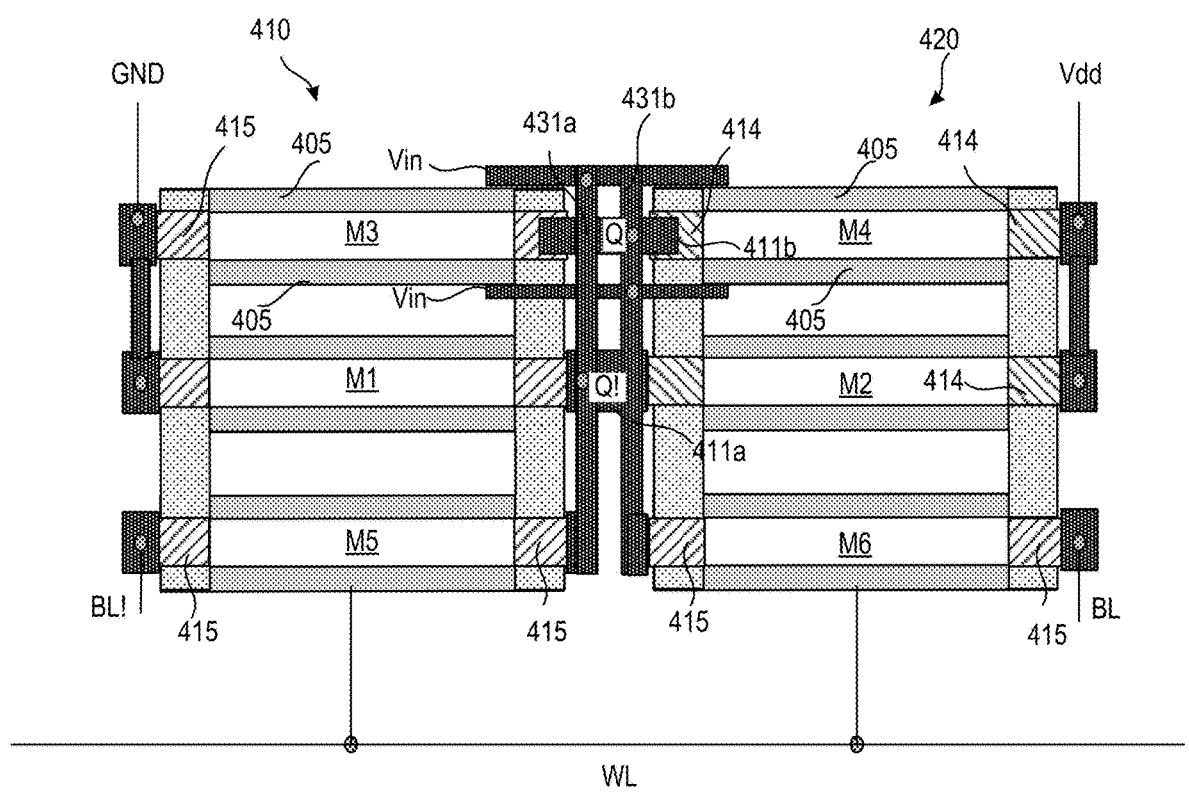
FIG. 4 is a cross section of a substrate segment showing an example 3D semiconductor device in accordance with another embodiment of the present disclosure.

FIG. 4 is a cross section of a substrate segment showing an example 3D semiconductor device in accordance with another embodiment of the present disclosure. This example implements the SRAM cell of FIG. 6 by way of a side-by-side 6T SRAM cell. In the embodiment of FIG. 4, access transistors on a bottom of the cell, and bit lines (B and B!) and word lines (WL) hook up to the cell from the bottom. Power rails for Vdd and GND hook up from the top of the cell.

FIG. 4 shows formation of two vertical stack of gate-all-around channels with gate protection material around channels M1-M6. As seen, the 3D SRAM cell includes stack 410 and 420 similar to the stacks of FIG. 1. In FIG. 4, like FIG. 1, channels M1, M3, M5, and M6 have future N+ regions, with channels M2 and M4 having future P+ regions. One difference in FIG. 4 is that channels M2 and M4 are located as a top channel and middle channel of the right stack instead of a bottom channel and middle channel of the right stack. A connecting structure 411a extends in the horizontal direction to physically connect a first pair of facing S/D regions for M1 and M2 of the stacks to each other. Similarly, a connecting structure 411b extends in the horizontal direction to physically connect a second pair of facing S/D regions for M3 and M4 of the stacks to each other. Connecting structure 411a corresponds to Q! of FIG. 6, and connection structure 411b corresponds to Q of FIG. 6. Facing S/D regions for M5 and M6 remain separated. Local metal interconnect structures electrically connect the transistors to form an SRAM cell, with electrical connections denoted by nodes 101. In the embodiment of FIG. 1, first and second metal interconnect structures 131a, 131b contact facing S/D regions of M5 and M6 which are maintained as physically separated from one another.

FIGS. 5A-5F are cross sections of intermediate structures formed during the process of fabricating the 3D SRAM of FIG. 4. Initial processing steps to form the device of FIG. 4 are similar to those performed to form the device of FIG. 1 in that S/D regions are first formed in one stack while protecting the other stack, and then channels ends of the other stack are progressively revealed to form corresponding S/D regions on the second stack (right side stack). The initial processing steps to form the device of FIG. 4 are similar to FIGS. 3A-3E and result in the structure of FIG. 5A which shows N+ S/D regions covered with a protection film 416, and the stack 420 protected by oxide 418.

Figure 5A:
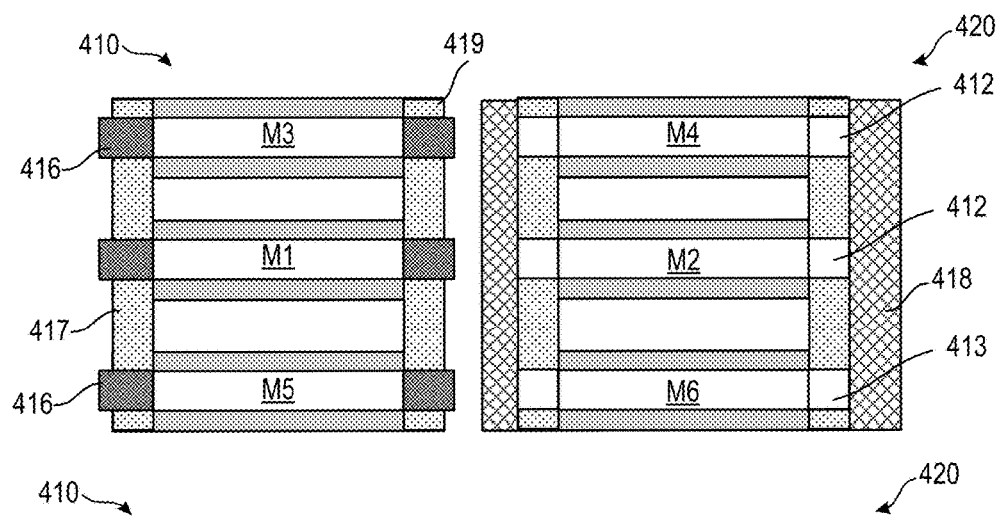
FIGS. 5A, 5B, 5C, 5D, 5E, 5E' and 5F are cross sectional views of intermediate structures in an example process of forming the SRAM cell of FIG. 4.
Figure 5B:
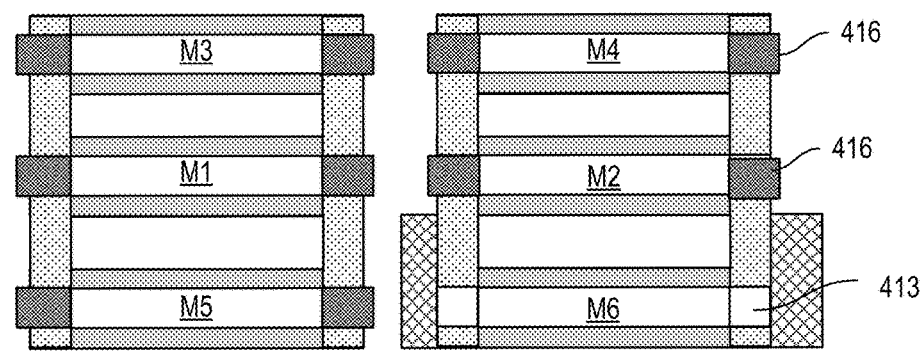

Next, from a top-down direction, a portion of the second nano-channel stack 420 is uncovered while one or more nano-channels positioned under that portion remain covered. The step can be performed by a reactive-ion etch (RIE) that directionally etches oxide until uncovering a channel. The portion uncovered can reveal ends of one or more nano-channels. In the example in FIG. 5B, channels M4 and M2 are uncovered, while channel M6 remains covered. P+ epitaxial S/D regions 415 are then grown for channels M4 and M2, followed by selective deposition of a protective film 416, such as a high-K film, over the P+ S/D regions of the right stack 420 as shown in FIG. 5B.

Figure 5C:
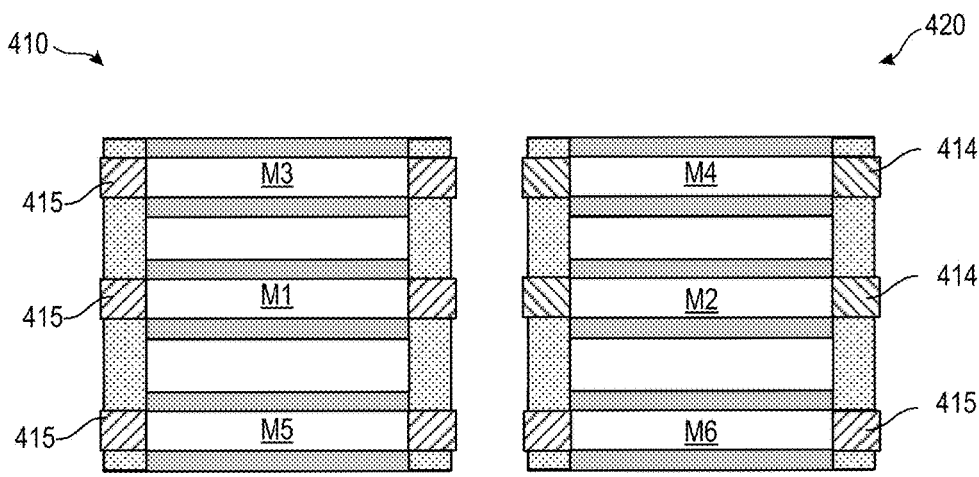

The remaining oxide covering the ends of the vertical stack 420 on the right is removed by reactive ion etching, which uncovers future N+ S/D region 413. N+ epitaxial S/D regions 114 are then grown on the stack 120 on the right, followed by removal of the protective film from all S/D regions with both stacks completed and with each stack having different S/D formation. At this point, all the S/D regions are formed for 3D SRAM as shown in FIG. 5C.

Figure 5D:
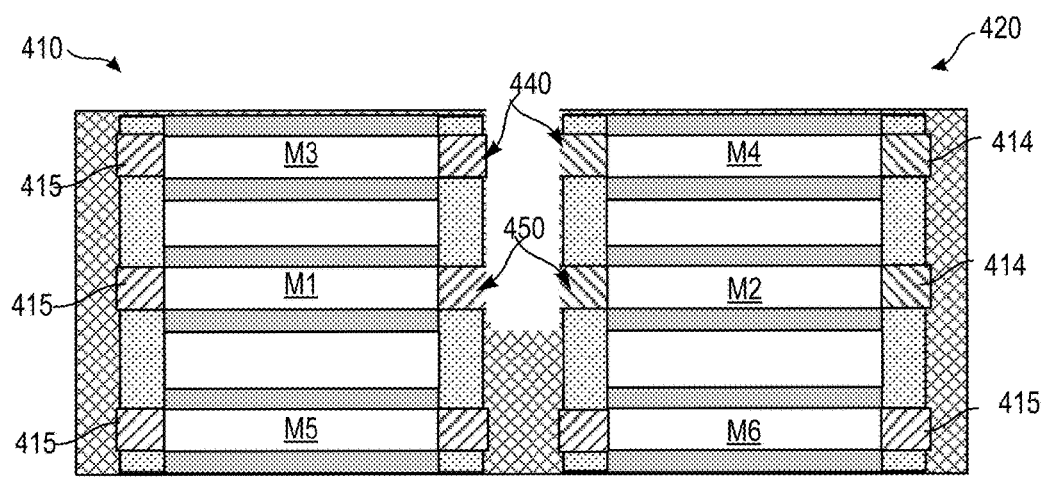

An oxide or insulator is then deposited on the substrate to cover all S/D regions for 6T 3D cell, and polished back, followed an etch step to uncover S/D edges 440 for M3/M4 and S/D edges 450 for M1/M2, as shown in FIG. 5D.

Figure 5E:
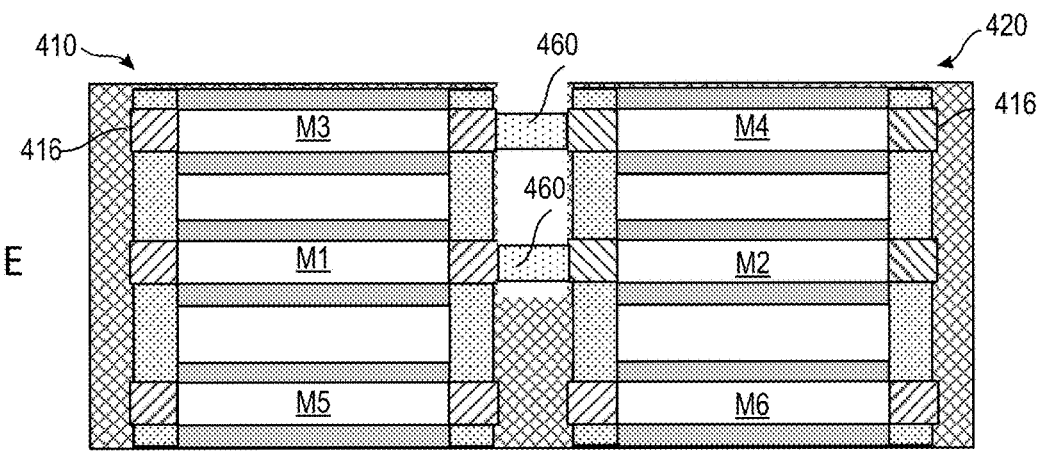
Figure 5E:
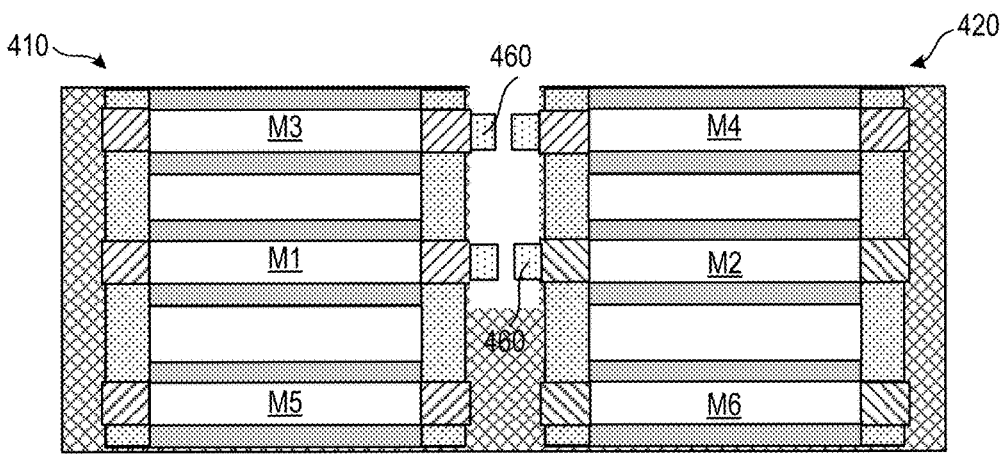
Figure 5F:
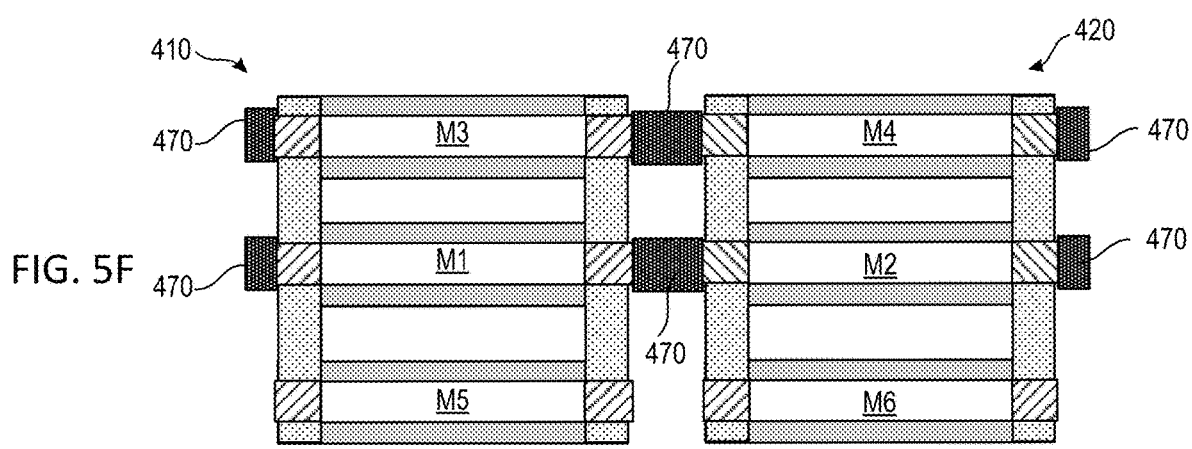

In FIG. 5E, connection material 460 is grown to connect the M3 and M4 regions together, and to connect the M1 and M2 regions together. Note that the M5/M6 region will not grow together because they are covered by oxide 418. These transistors are kept separate to become pass transistors. FIG. 5E' shows an alternative to FIG. 5E. As seen, a small gap may be left between M3 and M4, and between M1 and M2 regions. After forming connection structures as shown in FIG. 5E or 5E', a wet oxide etch is used to uncover the remaining edges of the N+ and P+ regions of M1-M4 transistors. A metal 470, such as Ru, is then deposited on the connection structures and the exposed edges as seen in FIG. 5F. Where connection material 460 is partially grown as shown in FIG. 5E', the metal 470 fills the gap to complete the connection structures. Ru can be polished, and then salicidation can be executed, then stripped to make good connections. At this point, the S/D regions of inverter pairs of the SRAM cell are formed and S/D regions of the pass transistors are not connected and can be individually accessed in the SRAM circuit.

Further steps for finishing the SRAM circuit include forming local interconnects, replacement gate processing, and gate cut followed by additional metallization (not shown). Steps may include TiN, TaN, TiAl depositions, replacement metal gate P-type work function metal (RMG PWFM) removal, RMG final, gate cut (CMG), and forming M0 and M1 dual damascene metal layer horizontal and vertical connections, where M0 refers to a lower metal layer of the stack and M1 refers to an upper metal layer of the stack. Vertical vias may be used to connect wiring to the M0 and M1 layers, as is known in the art.

The work function metal layer may be a p-type or an n-type work function layer depending on the type (PFET or NFET) of the device. The p-type work function layer includes a metal selected from but not restricted to the group of titanium nitride (TiN), tantalum nitride (TaN), ruthenium (Ru), molybdenum (Mo), tungsten (W), platinum (Pt), or combinations thereof. The n-type work function layer includes a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. A metal fill layer may include aluminum (Al), tungsten (W), cobalt (Co), and/or other suitable materials.

In the dual damascene process, the structure undergoes a diffusion barrier etch step, after which a via dielectric is deposited. An etch step then forms a gap in which the lines and vias are formed.

A thin layer of barrier of tantalum (Ta) and tantalum nitride (TaN) materials are deposited using physical vapor deposition (PVD). Ta is used to form the liner and TaN is for the barrier in a structure. The barrier layer is coated over by a copper seed barrier via physical vapor deposition (PVD). And finally, the structure is electroplated with copper and polished planar using chemical mechanical polishing (CMP).

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts may be executed independently of each other or in combination with each other. Accordingly, the aspects of the present disclosure may be embodied and viewed in many different wa In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of fabricating a semiconductor device, the method comprising:
    forming a first stack of first transistor structures on a substrate, each first transistor structure comprising a channel extending in a horizontal direction along a surface of the substrate and a pair of S/D regions formed on opposite ends of the channel, wherein the first transistor structures are stacked in a vertical direction along a thickness direction of the substrate such that channel regions of the first stack are positioned over one another and S/D regions of the first stack are positioned over one another;
    forming a second stack of second transistor structures on the substrate adjacent to the first stack, each second transistor structure comprising a channel extending in the horizontal direction and a pair of S/D regions formed on opposite ends of the channel, wherein the second transistor structures are stacked along the vertical direction such that channel regions of the second stack are positioned over one another and S/D regions of the second stack are positioned over one another, the second stack being formed adjacent to the first stack such that stacked S/D regions at an end of the first stack are facing respective stacked S/D regions at an end of the second stack;
    connecting a first pair of facing S/D regions of the first and second stack by forming a connecting structure that extends in the horizontal direction to physically connect the first pair of facing S/D regions to each other;
    maintaining a second pair of facing S/D regions of the first and second stack as a separated pair of facing S/D regions which are physically separated from one another; and
    forming first and second metal interconnect structures connected to respective S/D regions in the second pair of facing S/D regions.

2. The method of claim 1, wherein forming the first and second stacks comprises:
    forming the channels of the first stack;
    forming the channels of the second stack adjacent to the first stack;
    forming the S/D regions of the first stack while an area of the second stack is covered with protective material; and
    forming the S/D regions of the second stack while an area of the first stack is covered with protective material.

3. The method of claim 2, wherein the forming S/D regions of the first stack comprises simultaneously forming S/D regions of the same conductivity type on all channels of the first stack.

4. The method of claim 3, wherein the forming S/D regions of the second stack comprises:
    forming S/D regions of a first conductivity type on one of channels of the second stack while other channels of the second stack are covered with protective material; and
    forming S/D regions of a second conductivity type on another one of channels of the second stack while the S/D regions of the first conductivity type are covered with protective material.

5. The method of claim 1, wherein the connecting a first pair of facing S/D regions comprises growing connecting material from each S/D region in the first pair toward each other S/D region in the first pair of facing S/D regions.

6. The method of claim 5, wherein the growing comprises growing the connecting material from each S/D region in the first pair toward each other S/D region in the first pair of facing S/D regions until the connecting material joins to physically connect the S/D regions of the first pair of facing S/D regions to each other.

7. The method of claim 6, further comprising forming a metal on the connecting material.

8. The method of claim 5, wherein the growing comprises growing the connecting material from each S/D region in the first pair toward each other S/D region in the first pair of facing S/D regions without joining the connecting material.

9. The method of claim 8, further comprising forming a metal on the connecting material such that the metal joins the connecting material to physically connect the S/D regions of the first pair of facing S/D regions to each other.

10. A three dimensional (3D) semiconductor device comprising:
    a first stack of first transistor structures formed on a substrate, each first transistor structure comprising a channel extending in a horizontal direction along a surface of the substrate and a pair of S/D regions formed on opposite ends of the channel, wherein the first transistor structures are stacked along a vertical direction along thickness direction of the substrate such that channel regions of the first stack are positioned over one another and S/D regions of the first stack are positioned over one another;
    a second stack of second transistor structures formed on the substrate adjacent to the first stack, each second transistor structure comprising a channel extending in the horizontal direction and a pair of S/D regions formed on opposite ends of the channel, wherein the second transistor structures are stacked along the vertical direction such that channel regions of the second stack are positioned over one another and S/D regions of the second stack are positioned over one another, the second stack being formed adjacent to the first stack such that stacked S/D regions at an end of the first stack are facing respective stacked S/D regions at an end of the second stack;
    a connecting structure that extends in the horizontal direction to physically connect a first pair of facing S/D regions to each other; and
    first and second metal interconnect structures connected to respective S/D regions in a second pair of facing S/D regions of the first and second stack, the second pair of facing S/D regions being physically separated from one another of the first and second stack as a separated pair of facing S/D regions which are physically separated from each other.

11. The 3D semiconductor device of claim 10, wherein at least one of the first and second stacks has S/D regions all of a same conductivity type.

12. The 3D semiconductor device of claim 10, wherein at least one of the first and second stacks has S/D regions of different conductivity types.

13. The 3D semiconductor device of claim 10, wherein the connecting structure comprises epitaxially grown connecting material which physically connects the S/D regions of the first pair of facing S/D regions to each other.

14. The 3D semiconductor device of claim 10, wherein the connecting structure comprises:
  epitaxially grown connecting material which does not connect the S/D regions of the first pair of facing S/D regions; and
  a metal formed on the connecting material such that the metal joins the connecting material to physically connect the S/D regions of the first pair of facing S/D regions to each other.

15. A method of fabricating a semiconductor device, the method comprising:
  forming a first stack of transistor channels adjacent to a second stack of transistor channels, the stacks of transistor channels being gate-all-around transistor channels that extend horizontally and that are aligned vertically in that transistor channels are positioned over each other;
  forming first source/drain regions on transistor channels of the first stack while transistor channels of the second stack are covered;
forming source/drain regions on transistor channels of the second stack while source/drain regions on the first stack are covered, wherein forming source/drain regions on transistor channels of the second stack is executed with step-wise uncovering of channel ends to form either N-doped or P-doped source/drain regions selectively;
  growing first adjacent source/drain regions together between the first stack and the second stack while maintaining second adjacent source/drain regions physically separated from each other; and
  electrically connecting transistors in the first stack and the second stack to form an SRAM cell.

16. The method of claim 15, wherein the growing first adjacent source/drain regions together forms a source/drain connection for an inverter pair of transistors for the SRAM cell.

17. The method of claim 16, wherein the maintaining second adjacent source/drain regions physically separated from each other forms pass transistors of the SRAM cell.

18. The method of claim 17, wherein the SRAM cell is a six transistor SRAM cell, the method further comprising growing third first adjacent source/drain regions together between the first stack and the second stack to form another inverter pair of transistors for the SRAM cell, while maintaining the second adjacent source/drain regions physically separated from each other.

19. The method of claim 18, further comprising forming the pass transistors positioned as top channels of the first stack and the second stack.

20. The method of claim 18, further comprising forming the pass transistors positioned as bottom channels of the first stack and the second stack.

* * * * *